(12) United States Patent
Hellmund et al.

(10) Patent No.: US 10,177,033 B2
(45) Date of Patent: Jan. 8, 2019

(54) METHODS FOR FORMING A SEMICONDUCTOR DEVICE AND SEMICONDUCTOR DEVICES

(71) Applicant: Infineon Technologies AG, Neubiberg (DE)

(72) Inventors: Oliver Hellmund, Neubiberg (DE); Peter Irsigler, Obernberg/Inn (AT); Sebastian Schmidt, Munich (DE); Hans-Joachim Schulze, Taufkirchen (DE); Martina Seider-Schmidt, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/629,165

(22) Filed: Jun. 21, 2017

(65) Prior Publication Data

US 2017/0365516 A1 Dec. 21, 2017

(30) Foreign Application Priority Data

Jun. 21, 2016 (DE) .................. 10 2016 111 321

(51) Int. Cl.
*H01L 21/768* (2006.01)
*H01L 21/02* (2006.01)
(Continued)

(52) U.S. Cl.
CPC .... *H01L 21/76898* (2013.01); *H01L 21/0242* (2013.01); *H01L 23/481* (2013.01); *H01L 23/482* (2013.01); *H01L 23/495* (2013.01); *H01L 29/0657* (2013.01); *H01L 24/05* (2013.01); *H01L 2224/04026* (2013.01);
(Continued)

(58) Field of Classification Search
CPC ............. H01L 21/76898; H01L 23/495; H01L 21/0242; H01L 23/481
See application file for complete search history.

(56) References Cited

U.S. PATENT DOCUMENTS 5,729,052 A 3/1998 Tonti et al.
6,104,062 A 8/2000 Zeng
(Continued)

*Primary Examiner* — Jarrett J Stark
(74) *Attorney, Agent, or Firm* — Slater Matsil, LLP

(57) ABSTRACT

A method for forming a semiconductor device includes forming a plurality of non-semiconductor material portions at a first side of a semiconductor substrate; forming semiconductor material on the plurality of non-semiconductor material portions to bury the plurality of non-semiconductor material portions within semiconductor material; removing at least a portion of the semiconductor substrate from a second side of the semiconductor substrate to uncover the plurality of non-semiconductor material portions at a backside of the semiconductor device; and forming a rough surface at the backside of the semiconductor device by removing at least a subset of the plurality of non-semiconductor material portions while at least a part of a semiconductor material located laterally between the plurality of non-semiconductor material portions remains or by removing at least a part of a semiconductor material located laterally between the plurality of non-semiconductor material portions while the plurality of non-semiconductor material portions remain.

19 Claims, 6 Drawing Sheets

(51) Int. Cl.

| | |
|---|---|
| *H01L 23/48* | (2006.01) |
| *H01L 23/495* | (2006.01) |
| *H01L 23/482* | (2006.01) |
| *H01L 29/06* | (2006.01) |
| *H01L 23/00* | (2006.01) |

(52) U.S. Cl.
CPC ............... *H01L 2224/05559* (2013.01); *H01L 2224/05572* (2013.01); *H01L 2224/291* (2013.01); *H01L 2224/32225* (2013.01); *H01L 2224/32245* (2013.01)

(56) References Cited

U.S. PATENT DOCUMENTS

| | | | |
|---|---|---|---|
| 2006/0211210 A1 | 9/2006 | Bhat et al. | |
| 2008/0179611 A1* | 7/2008 | Chitnis | H01L 33/508 257/98 |
| 2009/0302336 A1* | 12/2009 | Yuan | H01L 33/0079 257/98 |
| 2010/0167445 A1* | 7/2010 | Lee | H01L 27/14609 438/57 |
| 2010/0200880 A1* | 8/2010 | Sit | H01L 33/0079 257/98 |
| 2010/0246152 A1* | 9/2010 | Lin | H01L 21/563 361/783 |

* cited by examiner

METHODS FOR FORMING A SEMICONDUCTOR DEVICE AND SEMICONDUCTOR DEVICES

This application claims priority to German patent application No. 102016111321.2, filed on Jun. 21, 2016, which application is hereby incorporated herein by reference in its entirety.

TECHNICAL FIELD

Embodiments relate to backside contact concepts for semiconductor devices and in particular to methods for forming semiconductor devices and semiconductor devices.

BACKGROUND

Vertical power technologies for Power MOSFETs (metal-oxide-semiconductor-field-effect-transistor) need a good adhesion at backside. No optimized adhesion in mass production may mean reduced yield due to metal lift off or even electrical overstress in field. There may be a demand to provide an improved concept for semiconductor devices, which may allow an increased manufacturing yield and/or a reduced number of faulty devices.

SUMMARY

Some embodiments relate to a method for forming a semiconductor device. The method comprises forming a plurality of non-semiconductor material portions at a first side of a semiconductor substrate and forming semiconductor material on the plurality of non-semiconductor material portions to bury the plurality of non-semiconductor material portions within semiconductor material. Further, the method comprises removing at least a portion of the semiconductor substrate from a second side of the semiconductor substrate to uncover the plurality of non-semiconductor material portions at a backside of the semiconductor device. Additionally, the method comprises forming a rough surface at the backside of the semiconductor device by removing at least a subset of the plurality of non-semiconductor material portions while at least a part of a semiconductor material located laterally between the plurality of non-semiconductor material portions remains or by removing at least a part of a semiconductor material located laterally between the plurality of non-semiconductor material portions while the plurality of non-semiconductor material portions remain. Furthermore, the method comprises forming a backside metallization structure at the rough surface.

Some embodiments relate to a semiconductor device comprising at least one electrical element structure located at a front side of a semiconductor substrate. The at least one electrical element structure is configured to conduct current between the front side of the semiconductor substrate and a back side of the semiconductor substrate in a conductive state of the electrical element structure. Further, the semiconductor device comprises a plurality of non-semiconductor material portions located at a back side surface of the semiconductor substrate. A vertical distance of portions of the backside surface located laterally between the plurality of non-semiconductor material portions and surface portions of the plurality of non-semiconductor material portions having the largest vertical distance to the back side surface of the semiconductor substrate is larger than 200 nm. Further, the plurality of non-semiconductor material portions comprises an electrical resistance lower than an electrical resistance of portions of the semiconductor substrate. Additionally, the semiconductor device comprises a back side metallization structure arranged in contact with the plurality of non-semiconductor material portions and portions of the back side surface of the semiconductor substrate located laterally between the plurality of non-semiconductor material portions.

Some embodiments relate to a semiconductor device comprising at least one electrical element structure located at a front side of a semiconductor substrate. At least a rough portion of a backside surface of the semiconductor substrate comprises along at least one lateral direction repeatedly plateaus and trenches. Further, the trenches comprise substantially vertical side walls and a depth of the trenches is larger than 200 nm. Additionally, the semiconductor device comprises a back side metallization structure arranged in contact with at least the rough portion of the backside surface of the semiconductor substrate and a lead frame or printed circuit board electrically connected to the back side metallization structure.

BRIEF DESCRIPTION OF THE DRAWINGS

Some embodiments of apparatuses and/or methods will be described in the following by way of example only, and with reference to the accompanying figures, in which.

DETAILED DESCRIPTION OF ILLUSTRATIVE EMBODIMENTS

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
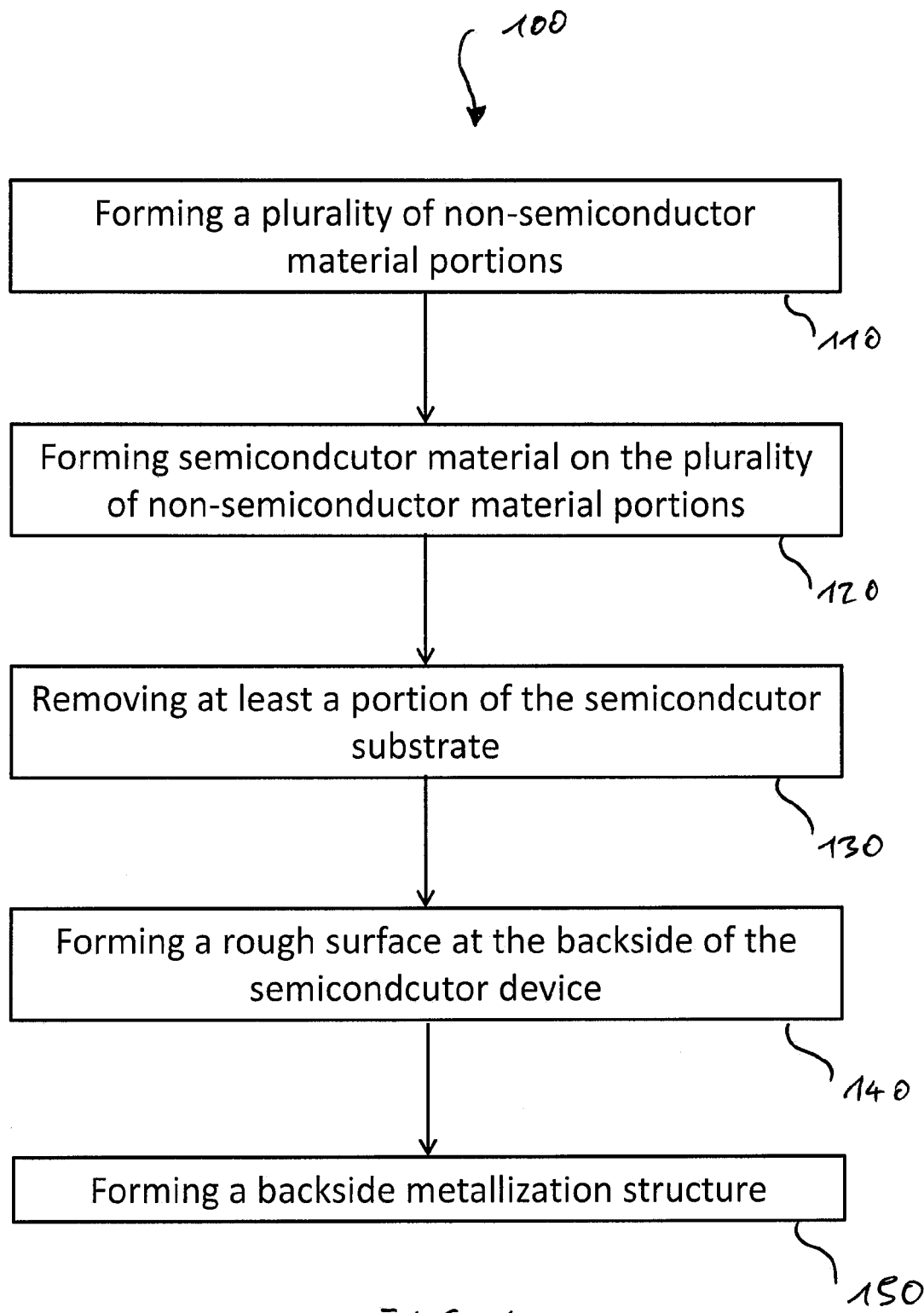
FIG. 1 shows a flow chart of a method for forming a semiconductor device.

FIG. 1 shows a flow chart of a method for forming a semiconductor device according to an embodiment. The method 100 comprises forming no a plurality of non-semiconductor material portions at a first side of a semiconductor substrate and forming 120 semiconductor material on the plurality of non-semiconductor material portions to bury the plurality of non-semiconductor material portions within semiconductor material. Further, the method 100 comprises removing 130 at least a portion of the semiconductor substrate starting from a second side of the semiconductor substrate to uncover the plurality of non-semiconductor material portions at a backside of the semiconductor device. Additionally, the method 100 comprises forming 140 a rough surface at the backside of the semiconductor device by removing at least a subset of the plurality of non-semiconductor material portions while at least a part of a semiconductor material located laterally between the plurality of non-semiconductor material portions remains or by removing at least a part of a semiconductor material located laterally between the plurality of non-semiconductor material portions while the plurality of non-semiconductor material portions remain. Furthermore, the method 100 comprises forming 150 a backside metallization structure at the rough surface.

By burying non-semiconductor material structures within the semiconductor material and removing the non-semiconductor material or semiconductor material located between the non-semiconductor material, a rough backside surface may be formable, which may be reproducible very accurately. In this way, the adhesion of the backside metallization at the backside of the semiconductor device may be improved and/or adjustable very accurately and/or selectable in a wide range. Therefore, the manufacturing yield may be increased and/or a number of faulty devices may be reduced.

The plurality of non-semiconductor material portions may be formed no directly on the first side surface of the semiconductor substrate or within trenches extending into the semiconductor substrate. For example, a non-semiconductor material layer may be formed (e.g. deposited or grown) on the semiconductor substrate and the non-semiconductor material layer may be structured (e.g. using a mask layer) to obtain the plurality of non-semiconductor material portions. Alternatively, one or more (plurality of) trenches may be formed (e.g. etched) into the semiconductor substrate from the first side of the semiconductor substrate and non-semiconductor material may be formed (e.g. deposited or grown) within the one or more trenches to obtain the plurality of non-semiconductor material portions. The non-semiconductor material portions of the plurality of non-semiconductor material portions are arranged in a repetitive pattern. The plurality of non-semiconductor material portions may be separated from each other and may comprise each a square shape, a rectangular shape, a circular shape, a ring shape (e.g. concentric rings) or a combination of these shapes in a top view of the semiconductor device or may be arranged adjacent to each other to form a meander in a top view of the semiconductor device.

For example, each non-semiconductor material portion of the plurality of non-semiconductor material portions may comprise a vertical dimension or extension of more than 200 nm (or more than 500 nm, more than 1 μm or more than 2 μm). Further, each non-semiconductor material portion of the plurality of non-semiconductor material portions may comprise a vertical dimension or extension of less than 5 μm (or less than 3 μm or less than 2 μm). For example, each non-semiconductor material portion of the plurality of non-semiconductor material portions may comprise a lateral width of more than 100 nm (or more than 200 nm, more than 500 nm or more than 1 μm). Further, each non-semiconductor material portion of the plurality of non-semiconductor material portions may comprise a lateral width of less than 3 μm (or less than 2 μm, or less than 1 μm). Keeping the lateral width low may enable a large increase of the surface area at the backside and/or may enable a low defect density for the semiconductor material formed to cover the non-semiconductor material portions due to an easier lateral overgrowth, for example. The lateral width of a non-semiconductor material portion may be a minimal lateral dimension of a non-semiconductor material portion or an average lateral width (e.g. averaged along a length of the non-semiconductor material portion) of the non-semiconductor material portion.

For example, a (minimal) lateral distance between (each two) neighboring non-semiconductor material portions of the plurality of non-semiconductor material portions along at least one (first) lateral direction may be larger than 100 nm (or more than 200 nm, more than 500 nm or more than 1 μm). The distance between non-semiconductor material portions may be kept large enough to enable an epitaxial growth of semiconductor material between the non-semiconductor material portions, for example. Further, neighboring non-semiconductor material portions of the plurality of non-semiconductor material portions along a second lateral direction orthogonal to the first lateral direction may be arranged adjacent to each other or may be spaced apart from each other by more than 200 nm as well. Further, a (minimal) lateral distance between (each two) neighboring non-semiconductor material portions of the plurality of non-semiconductor material portions along at least one lateral direction may be less than 20 μm (or less than 10 μm, less than 5 μm, less than 3 μm or less than 1 μm). Keeping the distance between neighboring non-semiconductor material portions low may enable a large increase of the surface area at the backside, for example.

For example, the plurality of non-semiconductor material portions comprise or consist of insulating material (e.g. silicon oxide or silicon nitride), carbide, ternary carbide, ternary nitride and/or metal.

Semiconductor material may be formed 120 (e.g. deposited or grown) directly on the non-semiconductor material portions and directly on portions of the semiconductor substrate located laterally between the non-semiconductor material portions. For example, the semiconductor material may be epitaxially grown so that the crystal lattice of the semiconductor substrate is reproduced and continued by the grown semiconductor material. For example, the semiconductor material formed 120 on the non-semiconductor material portions has the same material composition as the semiconductor substrate. For example, the non-semiconductor material portions may be covered due to a lateral overgrowth during the epitaxially growth of the semiconductor material. In other words, the formation 120 of the semiconductor material on the plurality of non-semiconductor material portions may comprise epitaxially growing the semiconductor material so that the plurality of non-semiconductor material portions are buried within semiconductor material (of the semiconductor substrate and semiconductor material formed on the non-semiconductor material portions) due to lateral overgrowth.

For example, the semiconductor material may be formed on the plurality of non-semiconductor material portions with an arbitrary thickness larger than two times a minimal lateral width of the non-semiconductor material portions (e.g. to enable a lateral overgrowth). For example, the thickness of the semiconductor material above the non-semiconductor material portions may be selected depending on the type and/or voltage class of electrical element structures of the semiconductor device (e.g. to be formed at the surface of the semiconductor material). For example, the thickness (e.g. measured vertically between the non-semiconductor material portions and a surface of the semiconductor material) of the semiconductor material formed on the plurality of non-semiconductor material portions may be larger than 2 µm (or larger than 5 µm, larger than 10 µm, larger than 20 µm, larger than 50 µm or larger than 100 µm).

At least a portion of the semiconductor substrate may be removed 130 by grinding, etching (wet or dry chemical etching) and/or chemical mechanical polishing CMP until the non-semiconductor material portions of the plurality of non-semiconductor material portions are exposed at the backside of the semiconductor device. For example, the whole semiconductor substrate may be removed, if the non-semiconductor material portions were deposited and structured on the first surface of the semiconductor substrate. Alternatively, portions of the semiconductor substrate may remain laterally between the non-semiconductor material portions after the removal 130, if the non-semiconductor material portions were formed in trenches extending into the semiconductor substrate.

After uncovering the non-semiconductor material portions by removing 130 the semiconductor substrate, a substantially planar surface may be obtained at the backside of the semiconductor substrate. The planar surface may comprise surface portions formed by the non-semiconductor material portions and surface portions formed by semiconductor material (of the semiconductor substrate or the semiconductor material formed between the non-semiconductor material portions). Starting from the substantially planar backside surface, a rough surface may be obtained by removing the non-semiconductor material portions or removing at least portions of the semiconductor material located laterally between the non-semiconductor material portions.

Figure 3A:
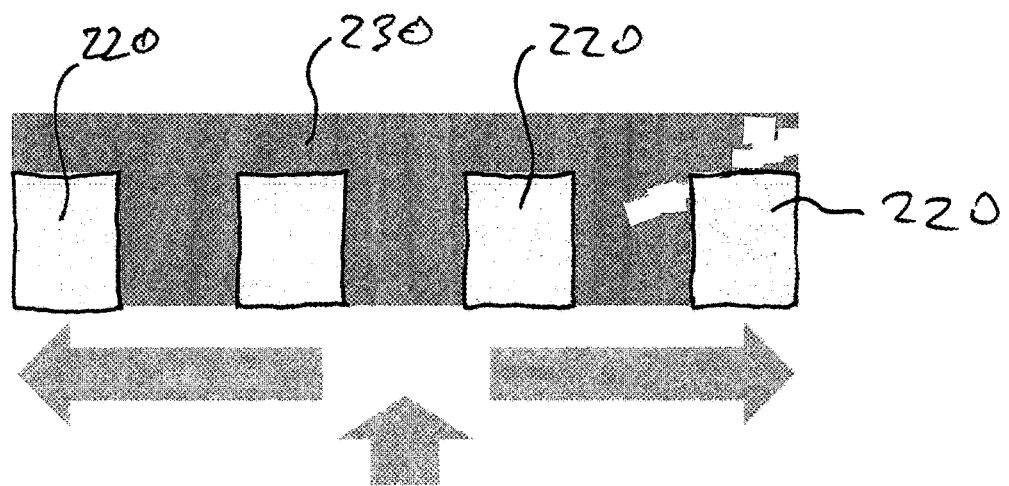
Figure 3B:
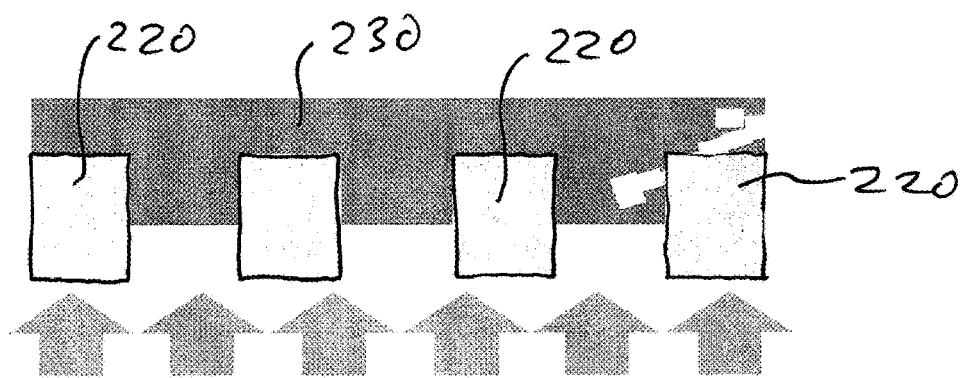
Figure 4A:
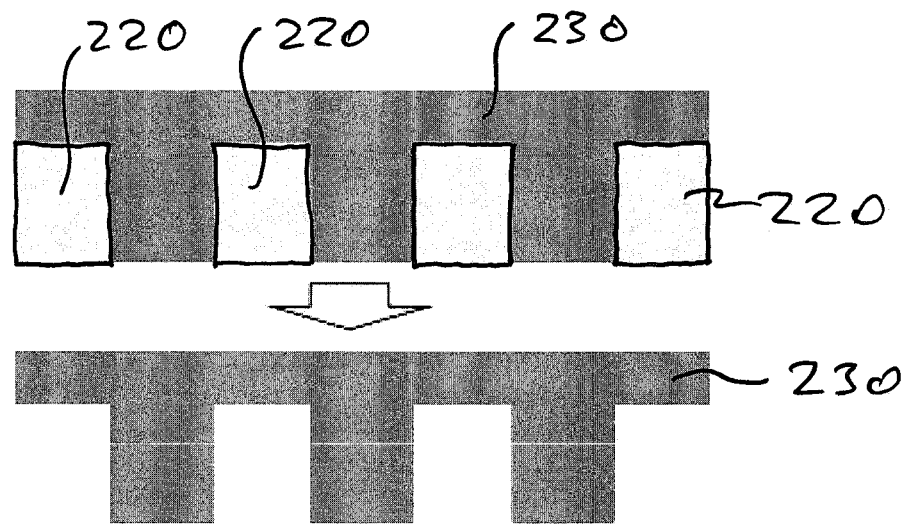
Figure 4B:
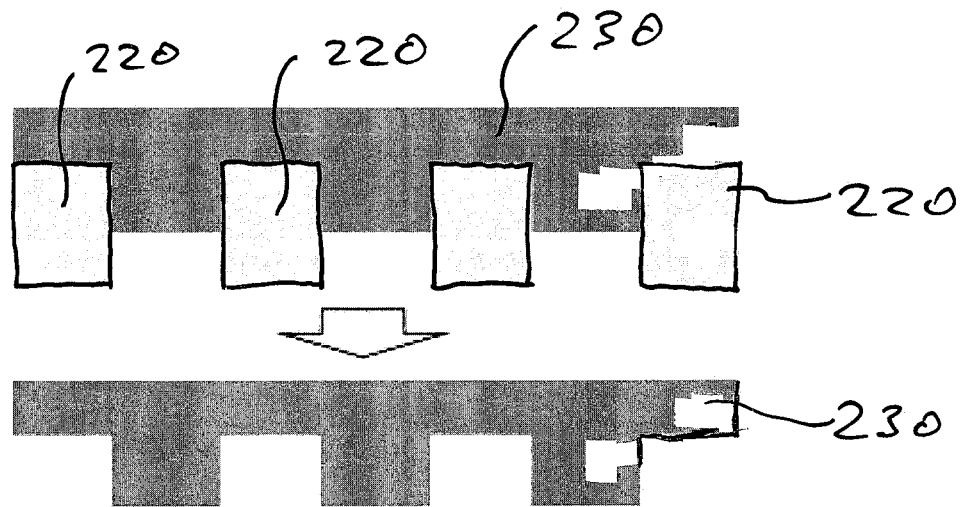
Figure 4C:
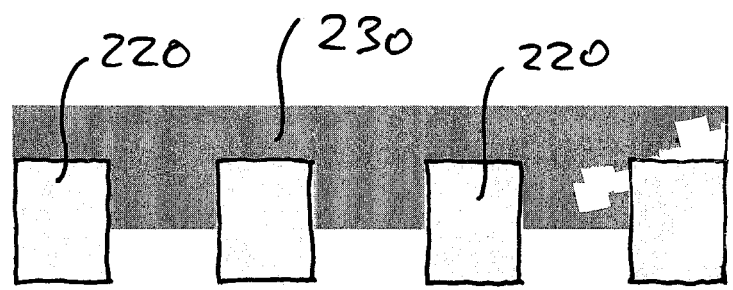

For example, the rough surface may be formed 140 by removing at least a part of a semiconductor material located laterally between the plurality of non-semiconductor material portions while the plurality of non-semiconductor material portions remain (e.g. FIGS. 3b and 4c). For example, the non-semiconductor material portions may comprise electrically conductive material (e.g. ternary carbide, ternary nitride or metal) so that an on-resistance of a vertical electrical element (e.g. diode or transistor conducting current between front side and backside) of the semiconductor device may be kept low or may be improved.

Alternatively, the rough surface may be formed 140 by removing at least a subset of the plurality of non-semiconductor material portions while at least a part of the semiconductor material located laterally between the plurality of non-semiconductor material portions remains (e.g. FIGS. 4a and 4b). For example, all non-semiconductor material portions may be removed or a subset of the non-semiconductor material portions (e.g. comprising insulating material) located in a predefined area (e.g. edge termination region) may remain at the backside. For example, a mask layer (e.g. photo resist or hard mask) may be formed at an edge termination region at the backside of the semiconductor device and non-semiconductor material portions of the plurality of non-semiconductor material portions are removed at regions uncovered by the mask layer (and others remain at the edge termination region covered by the mask layer). In this way, the emitter efficiency in one or more predefined areas may be adjusted (e.g. reduced) to a desired level, for example.

A rough surface may be a surface comprising a roughness (e.g. difference between maximal peak height and maximal valley depth) of more than 200 nm (or more than 500 nm, more than 1 µm or more than 2 µm).

The backside metallization structure comprises at least a metal layer and optionally a barrier layer and may be formed 150 by depositing at least a metal layer (e.g. aluminum or copper) or a barrier layer (e.g. titanium and/or titanium nitride) and a metal layer (directly) on the rough surface represented by surface portions of the non-semiconductor material portions and surface portions of semiconductor material located laterally between the non-semiconductor material portions, if the non-semiconductor material portions remain, or the backside surface of the semiconductor material, if the non-semiconductor material portions are removed. For example, the backside metallization structure is in contact with the plurality of non-semiconductor material portions, if the non-semiconductor material portions remain.

For example, the method 100 further comprises forming electrical element structures (e.g. transistors) at a front side of the semiconductor device (e.g. at a surface of the semiconductor material formed on the non-semiconductor material portions). The electrical element structures may be a transistor cell of a transistor arrangement (comprising a plurality of transistor cells connected in parallel) or the electrical element structure may comprise one or more transistor cells, for example.

The semiconductor substrate of the semiconductor device may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, a silicon germanium (SiGe) based semiconductor substrate, or gallium arsenide (GaAs)-based semiconductor substrate, or a gallium nitride (GaN)-based semiconductor substrate. The semiconductor substrate may be a semiconductor wafer.

For example, doping regions for electrical element structures may be formed at a (front side) surface of the semiconductor material formed on the non-semiconductor material portions and a wiring layer stack (e.g. including wiring structures and contact pads implemented by one or more metal layers and one or more via layers) may be formed on the (front side) surface of the semiconductor material before removing 130 at least the portion of the semiconductor substrate from the backside. Additionally, dopants may be implanted into a backside surface region before forming the backside metallization structure to increase a doping concentration in a portion of the semiconductor material located at the backside surface to enable an ohmic contact, for example. For example, a plurality of semiconductor devices may be formed on a semiconductor wafer and may be separated from each other after forming 150 the backside metallization structure. For example, the semiconductor device may be attached or assembled to a lead frame or a printed circuit board PCB (e.g. chip embedding) by soldering the backside metallization structure to a lead frame or a printed circuit board.

For example, a vertical direction, a vertical dimension or vertical extension and a thickness of a structure or a layer may be measured orthogonal to a first side surface (e.g. front side surface or main surface) of the semiconductor substrate and a lateral direction and a lateral dimension or lateral extension may be measured in parallel to the first side surface of the semiconductor substrate.

The front side of the semiconductor device may be the surface used to implement more sophisticated and complex structures than at the back side, since the process parameters (e.g. temperature) and the handling may be limited for the back side, if structures are already formed at one side of the semiconductor substrate, for example.

For example, the semiconductor device may be an integrated circuit, a processor device, a memory device, a sensor device or a power semiconductor device. For example, the semiconductor device comprises one or more electrical element structures (e.g. a diode structure or a transistor structure, for example an Insulated-Gate Bipolar Transistor (IGBT) or a Field Effect Transistor (FET)). For example, the (power) semiconductor device may comprise one or more vertical electrical element structures conducting a current (e.g. vertical diode) or controlling a current (e.g. vertical transistor) between a front side of the semiconductor device and a backside of the semiconductor device. Due to the vertical current flow, a reliable contact between the backside of the semiconductor substrate and a backside metallization may be important. A power semiconductor device or an electrical element structure (e.g. transistor structure or diode structure) of the power semiconductor device may have a breakdown voltage or blocking voltage of more than boy (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 500 V (e.g. a breakdown voltage of 1200 V, 1500 V, 1700V, 2000V, 3300V or 6500V), for example.

Figure 2:
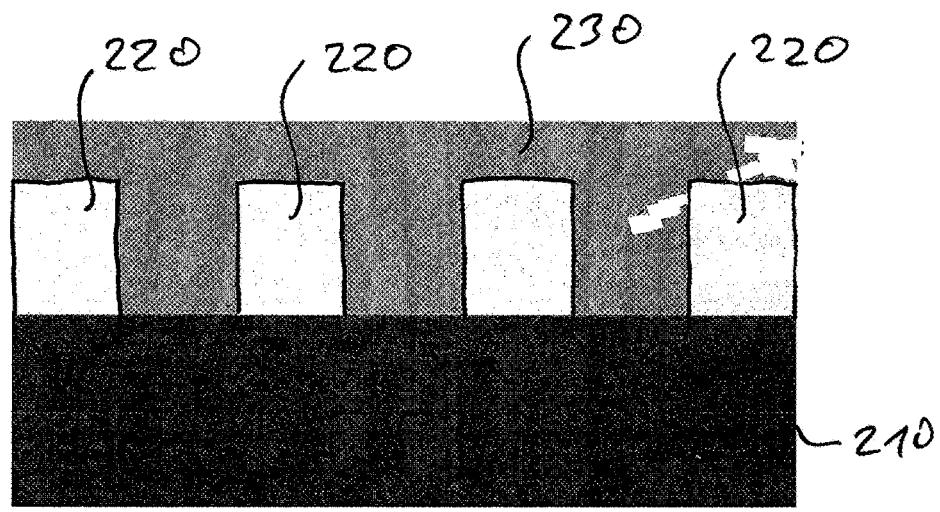
FIGS. 2, 3a, 3b, 4a, 4b and 4c show schematic cross sections of portions of semiconductor devices at different manufacturing stages.

FIGS. 2, 3a, 3b, 4a, 4b and 4c show schematic cross sections of portions of semiconductor devices at different manufacturing stages of a method for forming semiconductor devices according to an embodiment. FIG. 2 shows a portion of a semiconductor wafer 210 (e.g. silicon substrate) and a plurality of non-semiconductor material portions 220 (buried structures) is formed (e.g. deposited and structured) at a surface of the semiconductor wafer 210. Further, semiconductor material 230 (e.g. silicon) is formed (e.g. by epitaxial lateral overgrowth ELO) on the plurality of non-semiconductor material portions 220 (e.g. oxide, carbide, ternary carbides or ternary nitrides). Then the semiconductor wafer 210 is removed from the backside by CMP, mechanical grinding and/or etching. The removal of semiconductor material may be stopped as soon as the plurality of non-semiconductor material portions 220 are uncovered as shown in FIG. 3a or (additionally or directly) an etching may be continued or performed to remove additionally some of the semiconductor material located laterally between the plurality of non-semiconductor material portions 220 as shown in FIG. 3b.

Afterwards, the plurality of non-semiconductor material portions 220 may be removed as shown in FIGS. 4a and 4b. FIG. 4a shows an example for removing the plurality of non-semiconductor material portions 220 after obtaining a substantially planar surface after removing the semiconductor wafer as shown in FIG. 3a. FIG. 4b shows an example for removing the plurality of non-semiconductor material portions 220 after etching back the semiconductor material between the plurality of non-semiconductor material portions 220 as shown in FIG. 3b. In this example, the buried structures may be eliminated (e.g. by etching).

Alternatively, the buried structures may remain after etching back the semiconductor material (e.g. FIG. 3b) between the plurality of non-semiconductor material portions 220 as shown in FIG. 4c. In this example, the plurality of non-semiconductor material portions 220 may comprise electrically conductive material (e.g. ternary carbides or ternary nitrides).

More details and aspects of the method for forming semiconductor devices shown in FIG. 2-4c are mentioned in connection with the proposed concept or one or more examples described above. The method may comprise one or more additional optional features corresponding to one or more aspects of the proposed concept or one or more examples described above (e.g. FIG. 1) or below (e.g. FIG. 5-6).

Figure 5:
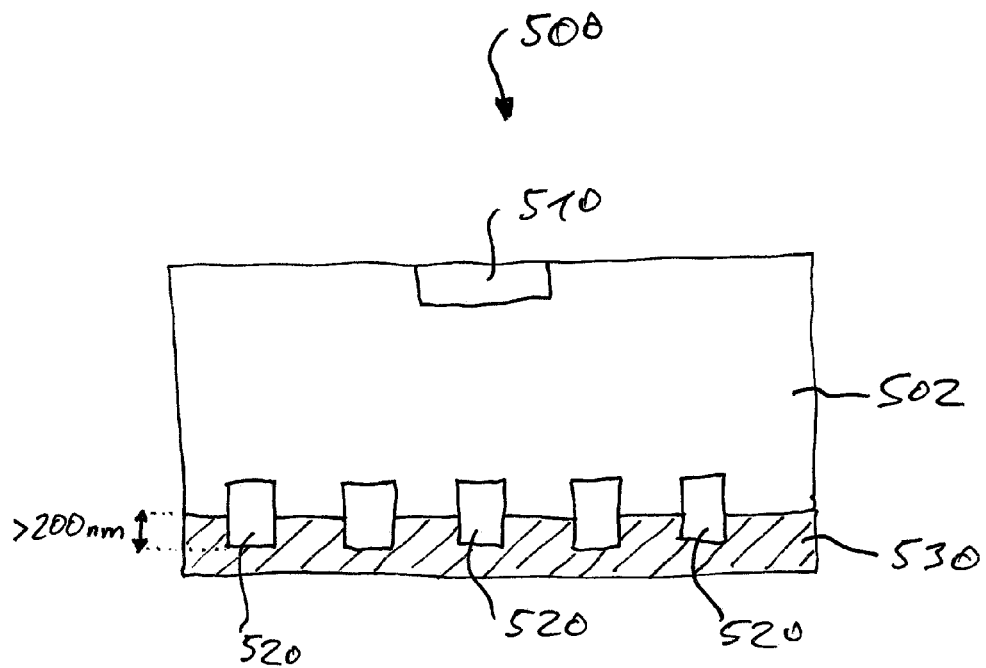
FIG. 5 shows a schematic cross section of a semiconductor device.

FIG. 5 shows a schematic cross section of a semiconductor device according to an embodiment. The semiconductor device 500 comprises at least one electrical element structure 510 located at a front side of a semiconductor substrate 502. The at least one electrical element structure 510 is configured to conduct current between the front side of the semiconductor substrate 502 and a back side of the semiconductor substrate 502 in a conductive state of the electrical element structure 510. Further, the semiconductor device 500 comprises a plurality of non-semiconductor material portions 520 located at a back side surface of the semiconductor substrate 502. A vertical distance of portions of the backside surface of the semiconductor substrate 502 located laterally between the plurality of non-semiconductor material portions 520 and surface portions of the plurality of non-semiconductor material portions 520 having the largest vertical distance to the back side surface of the semiconductor substrate 502 is larger than 200 nm (or more than 500 nm, more than 1 μm or more than 2 μm). Further, the plurality of non-semiconductor material portions 520 comprise an electrical resistance lower than an electrical resistance of portions of the semiconductor substrate 502. Additionally, the semiconductor device 500 comprises a back side metallization structure 530 arranged in contact with the plurality of non-semiconductor material portions 520 and portions of the back side surface of the semiconductor substrate 502 located laterally between the plurality of non-semiconductor material portions 520.

By burying non-semiconductor material structures within the semiconductor material, a rough backside surface may be formable, which may be reproducible very accurately. In this way, the adhesion of the backside metallization at the backside of the semiconductor device may be improved and/or adjustable very accurately and/or selectable in a wide range. Therefore, the manufacturing yield may be increased and/or a number of faulty devices may be reduced.

For example, the material of the plurality of non-semiconductor material portions 520 comprise an electrical resistance lower than (e.g. lower than 50%, lower than 10% or lower than 1%) an electrical resistance of a portion of the semiconductor substrate 502 (e.g. a drift region, body region and/or source region of the at least one electrical element structure).

For example, the electrical element structure 510 may be a vertical transistor structure conducting current between the front side of the semiconductor substrate 502 and the back side of the semiconductor substrate 502 in an on-state of the vertical transistor structure. Alternatively, the electrical element structure 510 may be a vertical diode structure conducting current between the front side of the semiconductor substrate 502 and the back side of the semiconductor substrate 502 in a forward biased state of the vertical diode structure.

The semiconductor substrate of the semiconductor device 500 may correspond to the semiconductor material formed on the non-semiconductor material portions (and optionally portions of the semiconductor substrate) mentioned in connection with FIG. 1, for example.

More details and aspects of the semiconductor device 500 are mentioned in connection with the proposed concept or one or more examples described above. The semiconductor device 500 may comprise one or more additional optional features corresponding to one or more aspects of the proposed concept or one or more examples described above (e.g. FIG. 1-4c) or below (e.g. FIG. 6).

Figure 6:
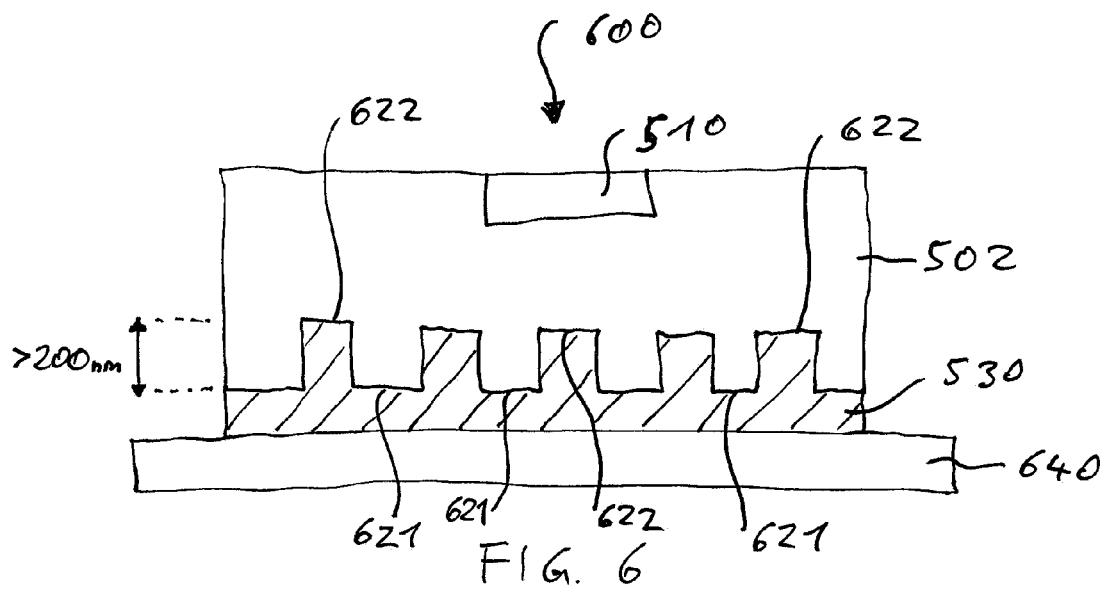
FIG. 6 shows a schematic cross section of another semiconductor device.

FIG. 6 shows a schematic cross section of a semiconductor device according to an embodiment. The semiconductor device 600 comprising at least one electrical element structure 510 located at a front side of a semiconductor substrate 502. At least a rough portion of a backside surface of the semiconductor substrate 502 comprises along at least one lateral direction repeatedly plateaus 621 and trenches 622. Further, the trenches 622 may comprise substantially vertical side walls. Further, a depth of the trenches 622 is larger than 200 nm (or more than 500 nm, more than 1 µm or more than 2 µm). Additionally, the semiconductor device 600 comprises a back side metallization structure 530 arranged in contact with at least the rough portion of the backside surface of the semiconductor substrate 502 and a lead frame or printed circuit board 640 electrically connected to the back side metallization structure 530.

By generating a rough backside surface with plateaus and trenches with substantially vertical side walls, the adhesion of the backside metallization at the backside of the semiconductor device may be improved and/or adjustable very accurately and/or selectable in a wide range. Therefore, the manufacturing yield may be increased and/or a number of faulty devices may be reduced.

For example, the rough portion of the backside surface of the semiconductor substrate 502 may be located at an active area of the semiconductor substrate (e.g. leaving out an edge termination region) or may extend over the whole backside surface of the semiconductor substrate 502.

For example, the rough portion of the backside surface of the semiconductor substrate 502 comprises along at least one lateral direction repeatedly plateaus 621 and trenches 622, if the plateaus 621 and/or trenches 622 are strip-shaped or meander-shaped, for example. Alternatively, the rough portion of the backside surface of the semiconductor substrate 502 comprises along two orthogonal lateral directions repeatedly plateaus 621 and trenches 622, if the plateaus 621 or trenches 622 are square-shaped or rectangular-shaped, for example.

The back side metallization structure 530 may be in contact with at least the (whole) rough portion of the backside surface of the semiconductor substrate 502 or the whole backside surface of the semiconductor substrate 502.

For example, the back side metallization structure 530 may be soldered to the lead frame or printed circuit board 640.

For example, a portion of the semiconductor substrate located closer than 200 nm to the backside surface of the semiconductor substrate may comprise a crystal defect density of more than 1000 per $cm^3$ (or more than 10000 per $cm^3$ or more than 1000000 per $cm^3$). A high defect density close to the backside surface of the semiconductor substrate may exist due to the manufacturing of the rough surface. For example, non-semiconductor material portions may be laterally overgrown by semiconductor material as described in connection with FIG. 1, for example. The semiconductor material formed close to the non-semiconductor material portions may comprise an increased defect density, which may remain after removing the non-semiconductor material portions. For example, an increased number of sidewall defects of the epi along the buried structures may be detectable (although the non-semiconductor material portions may be removed afterwards).

An angle between the substantially vertical side walls of the trenches and a front side surface of the semiconductor substrate may be between 70° and 110° (or between 80° and 100° or between 85° and 95°).

The semiconductor substrate of the semiconductor device 500 may correspond to the semiconductor material formed on non-semiconductor material portions (and optionally portions of the semiconductor substrate) mentioned in connection with FIG. 1, for example.

More details and aspects of the semiconductor device 600 are mentioned in connection with the proposed concept or one or more examples described above. The semiconductor device 600 may comprise one or more additional optional features corresponding to one or more aspects of the proposed concept or one or more examples described above (e.g. FIG. 1-5) or below.

Some embodiments relate to power devices with roughen backside BS for optimized adhesion. Defined roughening of power devices e.g. MOSFETs backside for reproducible adhesion of the backside metallization may be enabled. Furthermore, backside gettering techniques may be improved and also the removal of vacancy cluster-induced defects by a well-defined oxidation of the wafer backside may be enabled. Additionally, voids, which have been caused by the solder process, may be reduced or avoided.

Another concept to optimize adhesion may be to increase roughening of Silicon backside by wet etching, mechanical grinding or a combination of both. However, by using e.g. a grinding method there may be a Gauss distribution of roughening and as consequence also of the adhesion over a wafer lot. Additionally the total thickness variation may be dependent from etching and grinding time, but also from consistency of wet etch and abrasion of the grinding material.

A reproducible roughening may be structured by using an integrated etch stop e.g. based on buried oxide or buried carbide structures with backside etch stop in combination with different etching and thinning methods. Alternatively the buried structures may be realized also with ternary carbides or ternary nitrides, for example.

The backside thinning process itself may be implemented by or in combination with wet etch, dry etch, mechanical grinding and chemical mechanical polishing (CMP). In case of e.g. CMP, grinding or anisotropic etching the thinning process may stop at the buried structures e.g. by detection signal (e.g. FIG. 3a). In case of directly or additionally etching e.g. isotropic or crystal etching (e.g. having crystal direction depending different etch rates) the process may stop between sidewalls of structures (e.g. FIG. 3b). In case A (e.g. FIG. 4a) the buried structures as oxide or carbide may be finally eliminated e.g. by etching. As a result of this the final height and sidewall of remaining Si may be defining the roughening of backside; e.g. the roughness may be defined in a well-controlled manner by the design of the buried structures and the depth of the etching grooves between. In case B (e.g. FIG. 4c) the buried structures remain as ternary nitrides or ternary carbides, for example. Here FIG. 3b may be already describing the final roughening of the backside. Based on that, a realization of a meander (e.g. shape of the rough surface in a cross section) similar roughening may be possible and also reproducible in mass production.

The proposed concept may deal with a reproducible roughening for an optimized or improved adhesion.

Optionally, it may be possible that at least some of the oxide areas (non-semiconductor material portions) may remain on the backside to provide a well-defined local isolation of the wafer. An application may be a local reduction of the emitter efficiency in the area of the junction termination. Furthermore, it may be possible to provide a local roughening of the wafer backside which might not be feasible by mechanical treatments, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
    forming a plurality of non-semiconductor material portions at a first side of a semiconductor substrate;
    forming semiconductor material on the plurality of non-semiconductor material portions to bury the plurality of non-semiconductor material portions within semiconductor material;
    removing at least a portion of the semiconductor substrate from a second side of the semiconductor substrate to uncover the plurality of non-semiconductor material portions at a backside of the semiconductor device;
    forming a rough surface at the backside of the semiconductor device by
        forming a mask layer at an edge termination region at the backside of the semiconductor substrate, and
        after forming the mask layer, removing at least a subset of the plurality of non-semiconductor material portions while at least a part of a semiconductor material located laterally between the plurality of non-semiconductor material portions remains or by removing at least a part of a semiconductor material located laterally between the plurality of non-semiconductor material portions while the plurality of non-semiconductor material portions remain, wherein the subset of the plurality of non-semiconductor material portions are removed at regions uncovered by the mask layer; and forming a backside metallization structure at the rough surface.

2. The method according to claim 1, wherein the plurality of non-semiconductor material portions comprise a vertical dimension of more than 200 nm.

3. The method according to claim 1, wherein the plurality of non-semiconductor material portions comprise a vertical dimension of less than 5 μm.

4. The method according to claim 1, wherein the plurality of non-semiconductor material portions comprise a lateral width of more than 100 nm.

5. The method according to claim 1, wherein the plurality of non-semiconductor material portions comprise a lateral width of less than 3 μm.

6. The method according to claim 1, wherein a lateral distance between neighboring non-semiconductor material portions of the plurality of non-semiconductor material portions along at least one lateral direction is larger than 100 nm.

7. The method according to claim 1, wherein a lateral distance between neighboring non-semiconductor material portions of the plurality of non-semiconductor material portions along at least one lateral direction is less than 20 μM.

8. The method according to claim 1, wherein forming the plurality of non-semiconductor material portions comprises forming a plurality of trenches and forming non-semiconductor material within the plurality of trenches or forming a non-semiconductor material layer on the semiconductor substrate and structuring the non-semiconductor material layer.

9. The method according to claim 1, wherein a thickness of the semiconductor material formed on the plurality of non-semiconductor material portions is larger than 2 μm.

10. The method according to claim 1, wherein forming semiconductor material on the plurality of non-semiconductor material portions comprises epitaxially growing the semiconductor material so that the plurality of non-semiconductor material portions are buried due to lateral overgrowth.

11. The method according to claim 1, wherein the non-semiconductor material portions of the plurality of non-semiconductor material portions are arranged in a repetitive pattern.

12. The method according to claim 1, wherein the plurality of non-semiconductor material portions comprise insulating material.

13. The method according to claim 1, wherein the plurality of non-semiconductor material portions comprise ternary carbide, ternary nitride or metal.

14. The method according to claim 1, wherein the backside metallization structure is in contact with the plurality of non-semiconductor material portions.

15. The method according to claim 1, further comprising forming a plurality of electrical element structures at a surface of the semiconductor material formed on the plurality of non-semiconductor material portions.

16. The method according to claim 1, further comprising soldering the backside metallization structure to a lead frame or a printed circuit board.

17. The method according to claim 1, wherein the backside metallization structure entirely covers the backside of the semiconductor device.

18. A method for forming a semiconductor device, the method comprising:

forming a plurality of non-semiconductor material portions at a first side of a semiconductor substrate;

forming semiconductor material on the plurality of non-semiconductor material portions to bury the plurality of non-semiconductor material portions within semiconductor material;

removing at least a portion of the semiconductor substrate from a second side of the semiconductor substrate to uncover the plurality of non-semiconductor material portions at a backside of the semiconductor device;

forming a rough surface at the backside of the semiconductor device by forming a mask layer at an edge termination region at the backside of the semiconductor substrate, and after forming the mask layer, removing at least a subset of the plurality of non-semiconductor material portions while at least a part of a semiconductor material located laterally between the plurality of non-semiconductor material portions remains, wherein the subset of the plurality of non-semiconductor material portions are removed at regions uncovered by the mask layer; and forming a backside metallization structure at the rough surface.

19. The method according to claim 18, wherein the backside metallization structure entirely covers the backside of the semiconductor device.

* * * * *